(12) United States Patent
Villain et al.

(10) Patent No.: US 6,692,263 B2
(45) Date of Patent: Feb. 17, 2004

(54) SPRING CONNECTOR FOR ELECTRICALLY CONNECTING TRACKS OF A DISPLAY SCREEN WITH AN ELECTRICAL CIRCUIT

(75) Inventors: Jean-Christophe Villain, Colombes (FR); Frédéric Vogel, Asnieres sur Seine (FR); Bertrand Cupif, Antony (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/965,888

(22) Filed: Oct. 1, 2001

(65) Prior Publication Data

US 2002/0039849 A1 Apr. 4, 2002

(30) Foreign Application Priority Data

Oct. 2, 2000 (FR) .............................................. 00 12509

(51) Int. Cl.[7] ................................................. H01R 9/09
(52) U.S. Cl. ......................................... 439/66; 439/629
(58) Field of Search ................................. 361/784, 787, 361/789, 803; 439/65, 66, 74, 629

(56) References Cited

U.S. PATENT DOCUMENTS

| 4,245,876 A | * | 1/1981 | Ritchie et al. ............... 439/590 |
|---|---|---|---|
| 4,738,625 A | | 4/1988 | Burton et al. |
| 5,199,882 A | * | 4/1993 | Bates et al. .................... 439/66 |
| 5,259,770 A | * | 11/1993 | Bates et al. .................... 439/66 |
| 5,273,439 A | * | 12/1993 | Szerlip et al. ............... 439/485 |
| 5,436,744 A | | 7/1995 | Arledge et al. |
| 5,737,053 A | | 4/1998 | Yomogihara et al. |
| 5,766,023 A | * | 6/1998 | Noschese et al. ............. 439/62 |
| 5,938,455 A | | 8/1999 | Glovatsky et al. |
| 6,238,237 B1 | * | 5/2001 | Nagahata et al. ........... 439/493 |
| 6,312,263 B1 | * | 11/2001 | Higuchi et al. ............... 439/66 |

FOREIGN PATENT DOCUMENTS

JP    1-293592    11/1989

* cited by examiner

Primary Examiner—Neil Abrams
Assistant Examiner—Thanh-Tam Le
(74) Attorney, Agent, or Firm—Sughrue Mion, PLLC

(57) ABSTRACT

A spring connector for connecting at least one electrical track of a display screen with an electrical circuit also holds the display screen in position. A flexible metal foil forms a spring and a plastics material film which includes at least one electrical track has substantially the same shape as the metal foil and is fixed to one face of the metal foil. At least one of the tracks of the plastics material film connects tracks of the display screen with the electrical circuit.

12 Claims, 4 Drawing Sheets

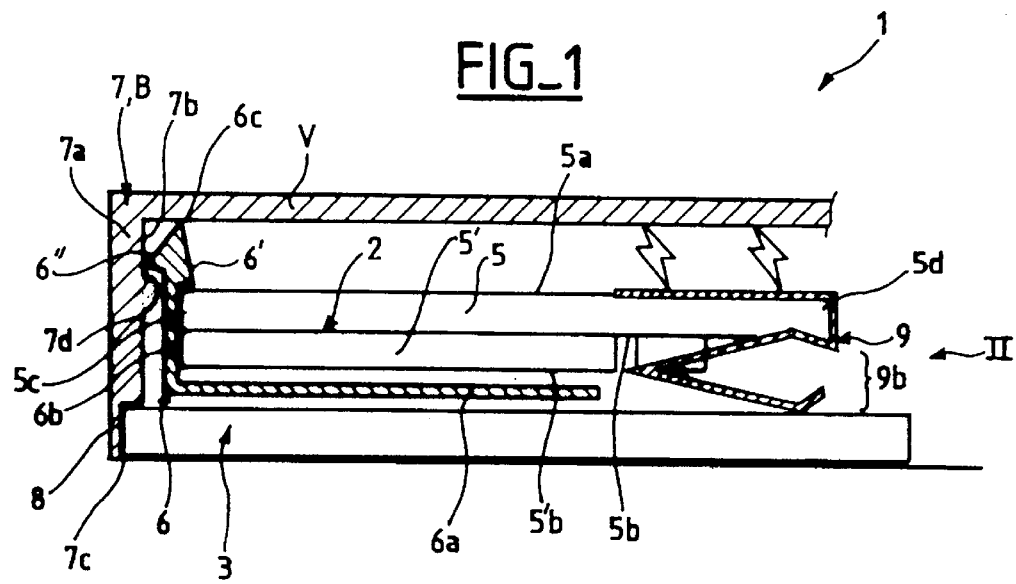
FIG_1
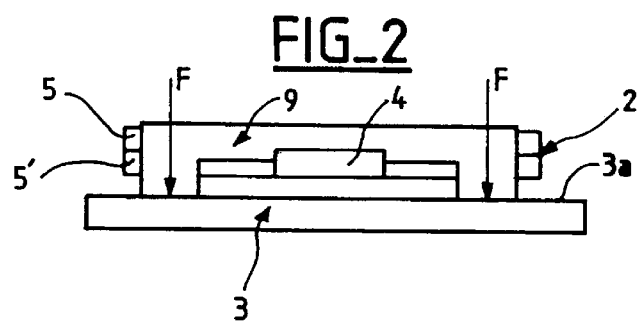
FIG_2
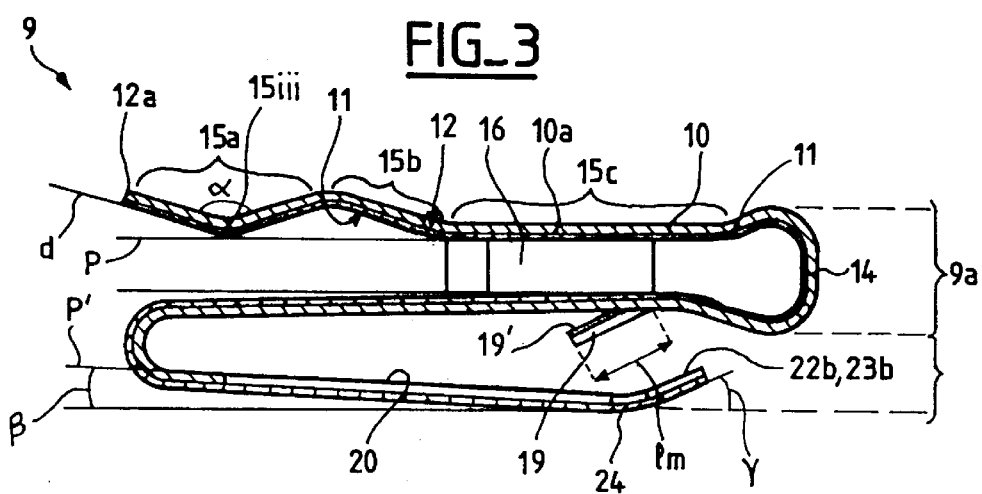
FIG_3

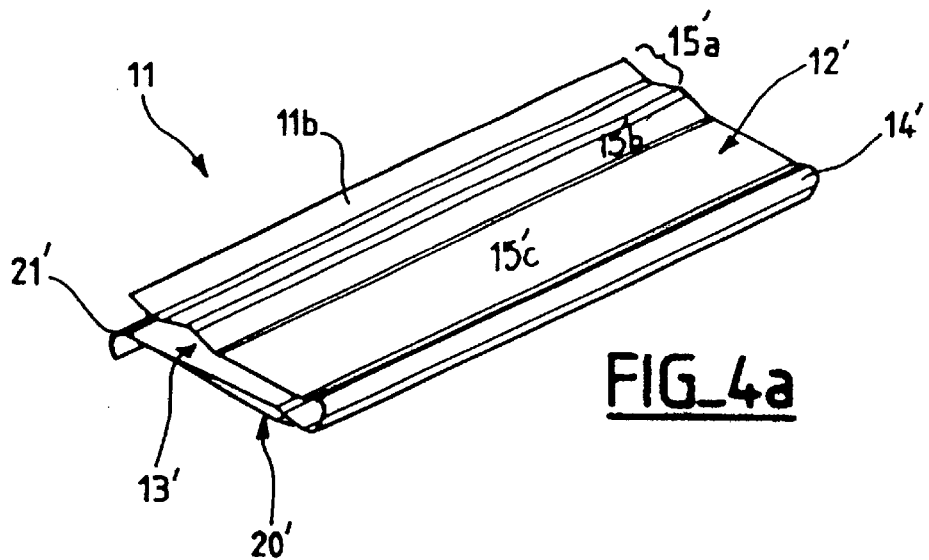
FIG_4a
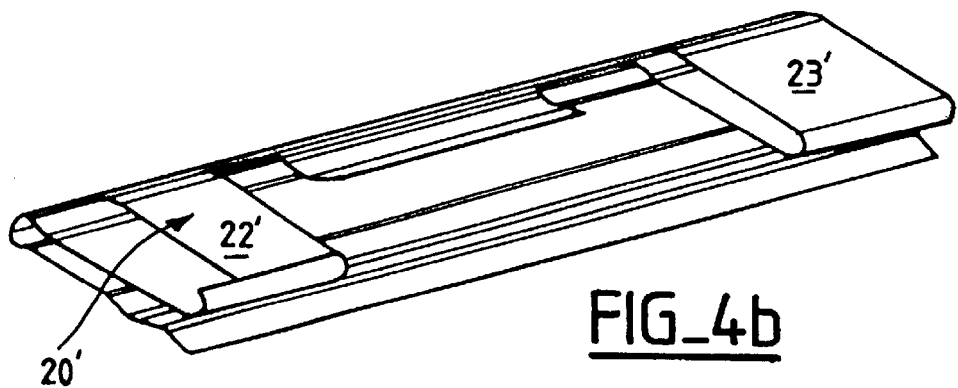
FIG_4b
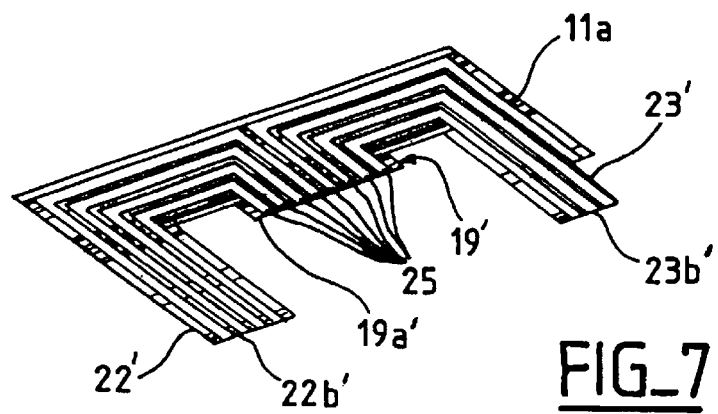
FIG_7

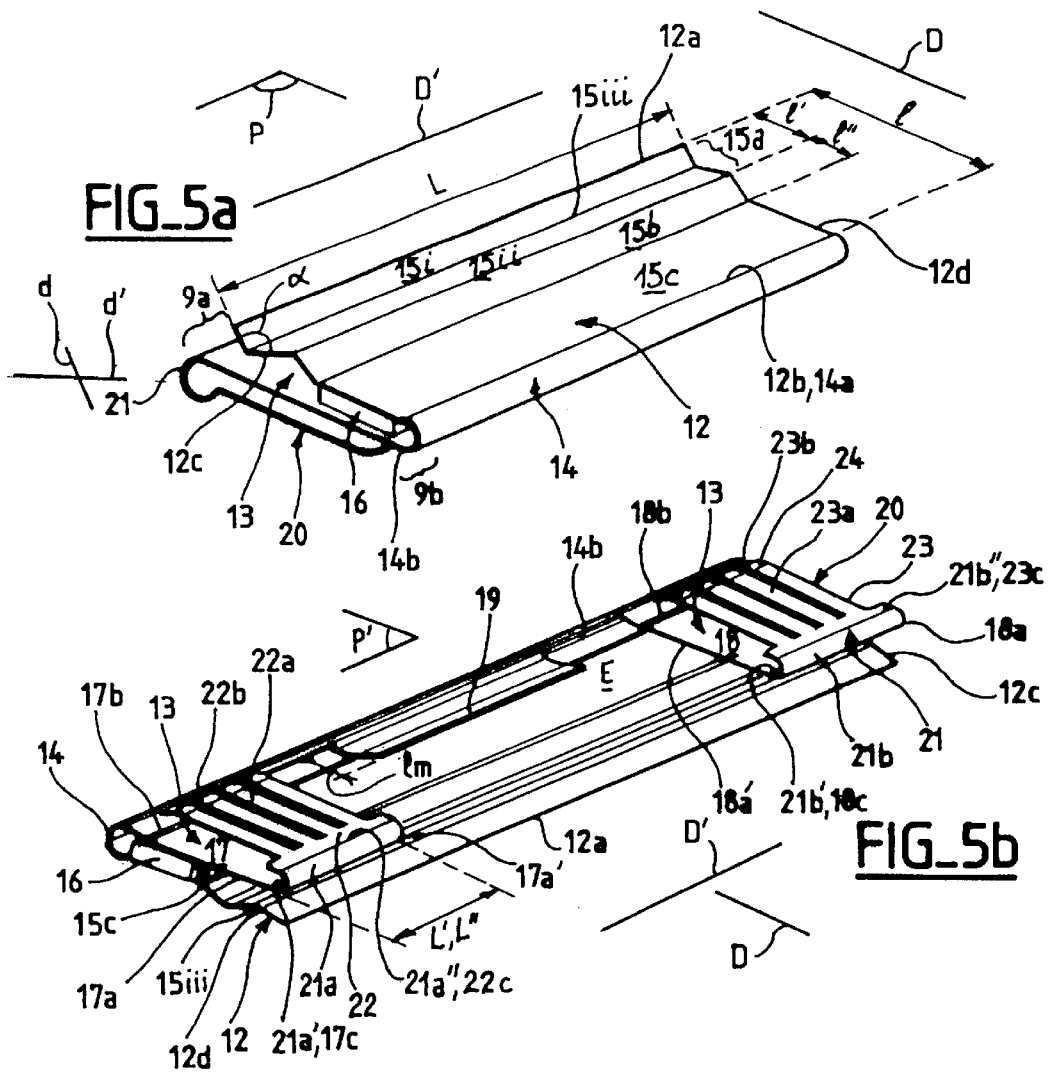
FIG_5a
FIG_5b
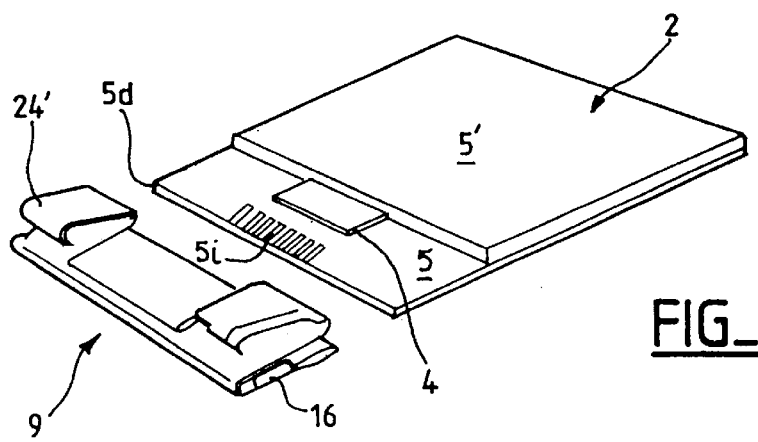
FIG_8a

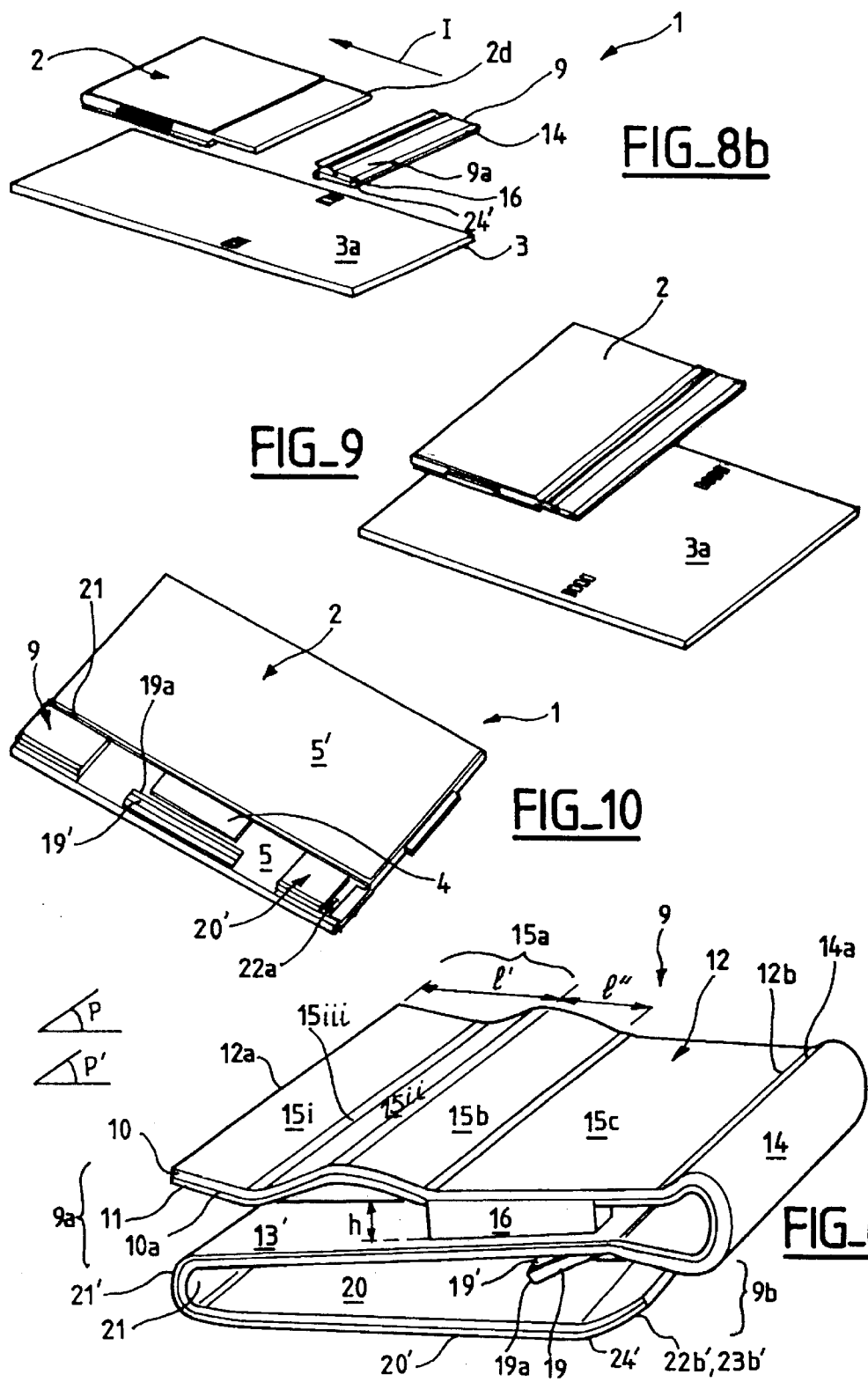

SPRING CONNECTOR FOR ELECTRICALLY CONNECTING TRACKS OF A DISPLAY SCREEN WITH AN ELECTRICAL CIRCUIT

CROSS-REFERENCE TO RELATED APPLICATIONS

This application is based on French Patent Application No. 00 12 509 filed Oct. 2, 2000, the disclosure of which is hereby incorporated by reference thereto in its entirety, and the priority of which is hereby claimed under 35 U.S.C. §119.

BACKGROUND OF THE INVENTION

1. Field of the Invention

The invention relates to a spring connector for electrically connecting at least one track of a display screen with an electrical circuit. It also relates to a display system including the spring connector and a terminal including the display.

2. Description of the Prior Art

The document WO-99/00877 discloses a metal spring connector for electrically connecting tracks of a liquid crystal display (LCD) screen to tracks of a printed circuit. The connector also holds the display screen in position.

Liquid crystal displays are covered with a material, such as indium tin oxide (ITO), that is fragile and therefore easily scratched by a metal connector of the type previously cited.

Another prior art solution interleaves a flexible connector between the tracks of the LCD and the tracks of the printed circuit. The connector is then compressed between the screen and the circuit. This kind of assembly is not simple and in the event of poor fixing the connection may be unreliable. Also, the force applied to the circuit is too high and the travel of the connector is too small to provide a reliable connection. An object of the invention is thus to alleviate the drawbacks of the prior art. It therefore proposes a connector not only for connecting a display to a printed circuit in a reliable and efficient manner, with no possibility of scratching the material covering the display screen, but also for holding the display in position. The connector is also easy to fit and remove.

SUMMARY OF THE INVENTION

The invention provides a spring connector for connecting at least one electrical track of a display screen with an electrical circuit, the connector including holding means for holding the display screen in position, a flexible metal foil forming a spring, and a plastics material film which includes at least one electrical track, has substantially the same shape as the metal foil, and is fixed to one face of the metal foil, wherein at least one of the tracks of the plastics material film is adapted to connect tracks of the display screen with the electrical circuit.

The spring connector is substantially S-shaped with a top part forming the means for holding the display screen in position.

The invention also provides a display system including a display screen, which includes at least one electrical track, an electrical circuit for controlling the display screen, and a spring connector of the type previously cited, wherein the display screen and the electrical circuit are disposed substantially facing each other.

The invention finally provides a terminal including the above display system and further including support means for supporting the display screen and the electrical circuit and spacer means for maintaining the spacing between the display screen and the electrical circuit.

The invention will become clearer in the light of the following description, which is given with reference to the accompanying drawings.

BRIEF DESCRIPTION OF THE DRAWINGS

FIG. 1 is a diagrammatic view in cross section of a display system according to the invention.

FIG. 2 is a diagrammatic partial view of the display system shown in FIG. 1, as seen in the direction of the arrow II.

FIG. 3 is a view of the spring connector according to the invention in cross section.

FIGS. 4a and 4b are respectively top and bottom perspective views of the plastics material film of the spring connector when it is bent to shape.

FIGS. 5a and 5b are respectively top and bottom perspective views of the metal foil of the spring connector when it is bent to shape.

FIG. 6 is a top perspective view of the spring connector including the assembled film and metal foil.

FIG. 7 is a plan view of the plastics material film before it is bent to shape, showing its tracks.

FIGS. 8a and 8b are respectively bottom and top perspective views of the display screen, the spring connector and the printed circuit when disassembled.

FIG. 9 is a view similar to FIG. 8b of the display screen and the spring connector when assembled.

Finally, FIG. 10 is a bottom perspective view of the display screen connected to the printed circuit by means of the spring connector.

DETAILED DESCRIPTION OF THE PREFERRED EMBODIMENT

Referring to FIG. 1, the display system 1 includes a display screen 2 substantially parallel to, facing and spaced from a printed circuit 3.

The display screen 2 is a liquid crystal display (LCD) screen and in this embodiment comprises first and second glass plates 5, 5' with the liquid crystal contained between them.

The first glass plate 5 is of generally parallelepiped shape, defining substantially rectangular top and bottom main faces 5a, 5b. The bottom main face 5b faces the printed circuit 3.

The free edges of respective shorter sides of two main faces 5a, 5b form a fixing edge 5c and a connecting edge 5d of the display screen 2.

At least the bottom main face 5b includes electrical tracks 5i (FIG. 8a) connecting components of the display screen 2 to a control device 4 for the screen, usually called the "driver". The electrical tracks 5i extend from the connection edge 5d.

In the embodiment shown, the control device 4 is fixed rigidly to the bottom main face 5b, near the connecting edge 5d.

The second glass plate 5' is rigidly fixed to the bottom main face 5b of the first glass plate 5. It extends from the fixing edge 5c substantially as far as the control device 4.

In a different embodiment, the control device 4 could be fixed to the second glass plate 5'.

The printed circuit 3 is in the conventional form of a printed circuit card, one face 3a of which carries components necessary in particular for transmitting information to be displayed on the display screen 2. The face 3a faces the bottom main face 5b.

The display system 1 includes a support device 6 for supporting the display screen 2 and a spacer device 7 for holding the display screen 1 at the required distance from the printed circuit 3.

In the embodiment shown, the support device 6 is formed of two substantially perpendicular walls 6a, 6b joined together at one edge. As shown in FIG. 1, the support device 6 has a substantially L-shaped cross section.

The wall 6a is substantially parallel to and extends along the bottom main face 5'b of the second glass plate 5'. The wall 6b is near the fixing edge 5c and extends away from the printed circuit 3.

The wall 6b has a first abutment 6' near its free end 6c and on the same side as the display screen 2. The abutment is located relative to the wall 6a so that the fixing edge 2c of the display screen 2 and the associated part of the light guide 5 are held between the first abutment 6' and the wall 6a.

The wall 6b has a second abutment 6" near its free end 6c and on the opposite side to the display screen 2.

The spacer device 7 includes a wall 7a substantially parallel to the wall 6b of the support device 6, on the opposite side to the display screen 2.

In the embodiment shown, the spacer device 7 is an integral part of the housing B of the terminal incorporating the display system 1. Accordingly, as shown in FIG. 1, the housing B includes a glass screen V substantially parallel to and extending along the top main face 5a of the display screen 2. The glass screen V adjoins the wall 7a so that their combination has a substantially L-shaped cross section.

The wall 6b has a first abutment 6' near its free end 6c and on the same side as the display screen 2. The abutment is located relative to the wall 6a so that the fixing edge 5c of the display screen 2 and the associated part of the light guide 5 are held between the first abutment 6' and the wall 6a.

The wall 7a has on its inside face 7b, which faces the support device 6, a lug 7d adapted to abut against the second abutment 6". The lug 7d is at a distance from the free edge 7c such that, when it is abutted against the second abutment 6", the display screen 2 is held away from the printed circuit 3. In this embodiment, it is approximately one millimeter away when the screen 2 is substantially parallel to the printed circuit 3.

In a different embodiment, the screen 2 could be inclined to the printed circuit 3. In this case, the connecting edge 5d would remain spaced from the printed circuit 3 at a substantially similar distance and the fixing edge 5c would be raised so that the display screen 2 and the printed circuit 3 would be at an angle less than or equal to 45° to each other. The spring connector 9 is described next with reference to FIGS. 3 and 6.

The connector 9 is formed of a flexible metal foil 10, constituting a spring, and a plastics material film 11. The metal foil 10 and the plastics material film 11 have substantially identical rectangular general shapes before the connector is bent to shape.

The plastics material film 11 is fixed to one face of the metal foil 10, namely its outside face 10a. In the embodiment shown, the plastics material film 11 is glued rigidly edge-to-edge to the metal foil 10.

When it is formed by bending the metal foil 10 and the plastics material film 11 to shape, the connector 9 has a substantially S-shaped cross section.

The top part 9a of the S-shape is intended to hold the display screen 2 in position, forming a clamp fitting over the connecting edge 5d, as explained later. The bottom part 9b of the S-shape is intended to be in contact with the electrical circuit 3.

The S-shape of the metal foil 10 is described in more detail next with reference to FIGS. 5a and 5b.

The top part 9a of the S-shape is formed of a top flange 12 and a middle flange 13 joined together by a supporting core 14.

The top flange 12 and the middle flange 13 face each other and are substantially parallel to each other in a plane P. They have substantially the same width I measured in a direction D. They have substantially the same length L measured in a direction D' perpendicular to the direction D.

The top flange 12 is delimited by a front free edge 12a opposite a connecting edge 12b from which the supporting core 14 extends. The front edge 12a and the connecting edge 12b are joined at each end by two lateral edges 12c, 12d. The two lateral edges 12c, 12d are parallel to each other in the direction D.

The top flange 12 has three adjoining portions 15a, 15b, 15c. The three portions 15a, 15b, 15c extend over the whole of the length L from the front edge 12a to the connecting edge 12b.

The first portion 15a extends from the front edge 12a over a width I' measured in the direction D which is of the order of one quarter the width I. It has a substantially V-shaped cross section over the whole of the length L. The first portion 15a has a bevel function.

Thus the first portion 15a is formed of:
a first branch 15i delimited by the front edge 12a and extending in a first direction d inclined to the plane P, and
a second branch 15ii adjoining the first branch 15i and the second portion 15b and extending in a second direction d' inclined to the plane P.

In the example shown, the angle α between the two branches 15i and 15ii is of the order of 150°.

The first portion 15a adjoins a second portion 15b extending over a width I" measured in the direction D of the order of one eighth the width I. The second portion 15b is inclined to the plane P in substantially the direction d. Its function is to reinforce the top flange 12.

Finally, the second portion 15b is followed by a plane third portion 15c substantially parallel to the plane P. The third portion 15c is aligned with the line of intersection 15iii between the branches 15i and 15ii.

The third portion 15c includes at least one guide wall 16 substantially perpendicular to the plane P and extending toward the middle flange 13. The guide wall 16 adjoins a lateral edge 12c, 12d. It has a height h (FIG. 6) measured perpendicularly to the plane P that is less than or equal to the distance between the top flange 12 and the middle flange 13.

In this embodiment, the third portion 15c has two parallel guide walls 16 each extending from a respective lateral edge 12c, 12d.

The supporting core 14 is substantially perpendicular to the top and middle flanges 12 and 13. It has two substantially parallel longitudinal edges 14a, 14b. One longitudinal edge 14a adjoins the connecting edge 12b and the other longitudinal edge 14b adjoins the middle flange 13.

The supporting core 14 has a substantially C-shaped cross section with the concave side facing toward the inside of the top part 9a. This shape increases the elasticity of the connector 9.

Referring to FIG. 5b, the middle flange 13 has two substantially identical end parts 17, 18 and a blade part 19. The three parts 17 to 19 adjoin the longitudinal edge 14b.

The end parts 17, 18 are substantially plane and each has a length L' measured in the direction D' of the order of one fifth the length L. They lie in a common plane parallel to the plane P.

Each end part 17, 18 has two parallel opposite free lateral edges 17a, 17a' and 18a, 18a', respectively. The lateral edges 17a and 18a face the respective lateral edges 12c and 12d of the top flange 12. Also, the lateral edges 17a' and 18a ' face each other and are separated by a gap E, part of which is occupied by the blade part 19.

Each end part 17, 18 further includes, substantially perpendicular to the lateral edges 17a, 17a ' and 18a, 18a', respectively:

an edge 17b, 18b adjoining the supporting core 14, and
a delimiter edge 17c, 18c delimiting the top part 9a.

The blade part 19 is disposed between the end parts 17, 18 and spaced from the lateral edges 17a' and 18a'. It has a substantially inverted V-shaped cross section over the whole of its length. Its concave side faces away from the top 9a of the connector 9. Also, the blade part 19 has a width $I_m$ measured in the direction D of the order of one quarter the width of the end parts 17, 18 measured in the same direction.

The bottom part 9b of the S-shape is formed by the middle flange 13 and a bottom flange 20 connected together by a connecting core 21.

The bottom flange 20 and the middle flange 13 face each other. They have substantially the same width I measured in the direction D.

The bottom flange 20 is formed by two spaced, separate and generally plane contact parts 22, 23 in the same plane P'. The plane P' is inclined relative to the plane P so that the height of the bottom part 9b occupies the free space between the display screen 2 and the printed circuit 3. The angle of inclination β of the bottom flange is of the order of 5° (FIG. 3).

Each contact part 22, 23 faces an end part 17, 18. It has a length L" measured in the direction D' substantially equal to the length L' of each end part 17, 18.

As shown in FIG. 5b, each contact part 22, 23 is shaped like a comb. In this embodiment it has four teeth 22a, 23a substantially parallel to each other, in the same plane and extending in the direction D.

It is to be noted that the comb-shape of the contact parts 22, 23 distributes forces over the bottom flange 20. This can be advantageous if the printed circuit 3 with which they come into contact is not perfectly flat. Of course, this particular shape is in no way exclusive, and other embodiments can be envisaged.

As can be seen in FIG. 3 in particular, the free edge 22b, 23b of each contact part 22, 23 is inclined toward the supporting core 14 at an angle γ relative to the plane P' of the order of 30°. A contact point 24 is thus formed, on the side opposite the middle flange 13, at the intersection between the raised free edge 22b, 23b and the main portion of the contact part 22, 23.

The connecting core 21 is formed of two substantially identical and coplanar core portions 21a, 21b. Like the supporting core 14, each core portion 21a, 21b is C-shaped with the concave side facing toward the inside of the bottom part 9b.

The longitudinal edges 21a', 21b' of each core portion 21a, 21b adjoin the delimiter edge 17c, 18c. The other longitudinal edges 21a", 21b" of each core portion 21a, 21b adjoin the edge 22c, 23c opposite the raised free edge 22b, 23b.

As shown in FIGS. 4a and 4b, the plastics material film 11 is substantially the same shape as the metal foil 10 when they are bent into the S-shape. The same reference numbers are therefore used as for the metal foil 10, with the suffix'.

The only difference lies in the shape of the bottom flange 20' of the plastics material film 11. This is formed of two continuous portions 22', 23' intended to cover the respective contact parts 22, 23 but having no teeth.

This shape covers the teeth 22a, 23a completely to provide them with good protection. In a different embodiment, the portions 22', 23' could also be comb-shaped.

The shape of one portion 22' is such that, when the plastics material film 11 covers one face of the metal foil 10, only one tooth 22a of the corresponding contact part 22 is not covered by the plastics material film 11 (FIGS. 4b and 10). When the connector 9 is fitted, that tooth 22a has a ground contact function. The metal connector is therefore connected to the ground of the circuit.

The plastics material film 11 also has at least one electrically conductive track 25 on one of its faces, referred to as the connection face 11a.

In the embodiment shown (FIG. 7), a plurality of tracks 25 extend from the free longitudinal edge 19a' of the blade part 19' to the raised free edges 22b', 23b' of each portion 22', 23'. The tracks 25 are distributed so that they cover the whole of the surface of the plastics material film 11. They are also spaced from each other so that they overlie the teeth 22a, 23a of the bottom flange 20.

The face 11b of the plastics material film 11 without the tracks 25 is fixed to the outside face 10a of the metal foil 10.

The assembly of the display system 1 of the invention is described next with reference to FIGS. 8a, 8b to 10.

The top part 9a of the connector 9 is interengaged with the connecting edge 2d of the display screen so that the free end of the connecting edge 2d abuts against the supporting core 14. The arrow I in FIG. 8a shows the insertion direction. Insertion of the connection edge 2d into the top part 9a is guided by the guide walls 16, among other things to ensure a good connection between the various tracks 5i, 25.

The longitudinal free edge 19a of the blade part 19 abuts against the control device 4 to make the connection between its contacts and the tracks 25 (see FIG. 10). Because of its shape, it also applies additional pressure to the display screen 2.

It is to be noted that the top flange 12 also protects the control device 4 from light and electrostatic discharges reaching the display screen 2.

In the embodiment shown in FIG. 10 the connecting core 21 is near the second glass plate 5'.

Finally, the contact point 24' on the bottom flange 20' of the plastics material film 11 comes into contact with the face 3a of the printed circuit 3 and applies a reaction force F to it (FIG. 2).

The display system 1 assembled in this way can easily be mounted inside a terminal, for example a telephone handset (not shown).

Of course, the invention is not limited to the embodiments that have just been described.

There is claimed:

1. A spring connector for connecting at least one electrical track of a display screen with an electrical circuit, said connector including holding means for holding said display screen in position, a flexible metal foil forming a spring, and a plastics material film which includes at least one electrical track, has substantially the same shape as said metal foil, and is fixed to one face of said metal foil, wherein at least one of said tracks of said plastics material film is adapted to connect tracks of said display screen with said electrical circuit.

2. The connector claimed in claim 1 wherein said connector has a substantially S-shaped cross section and has a top part which forms said holding means for holding said display screen in position.

3. A display system including a display screen, which includes at least one electrical track, an electrical circuit for controlling said display screen, and a spring connector as claimed in claim 1, wherein said display screen and said electrical circuit are disposed substantially facing each other.

4. The display system claimed in claim 3 wherein said connector has a substantially S-shaped cross section and has a top part which forms said holding means for holding said display screen in position, and said spring connector is disposed so that said plastics material film is in contact with said track or tracks of said display screen and with said electrical circuit, said top part of said S-shape of said spring connector is interengaged with an edge of said display screen, and a free end part of a bottom part of said S-shape is in contact with said electric circuit and applies a reaction force thereto.

5. The display system claimed in claim 3, further comprising a control device for said display screen, wherein said control device is fixed to a face of said display screen and connected to at least one of said tracks of said display screen.

6. A terminal including a display system according to claim 3 and further including support means for supporting said display screen and said electrical circuit and spacer means for maintaining the spacing between said display screen and said electrical circuit.

7. A spring connector for connecting at least one electrical track of a display screen with an electrical circuit, said connector including a holder coupled to said display screen and holding said display screen in position, a flexible metal foil forming a spring, and a plastics material film which includes at least one electrical track, has substantially the same shape as said metal foil, and is fixed to one face of said metal foil, wherein at least one of said tracks of said plastics material film is adapted to connect tracks of said display screen with said electrical circuit.

8. The connector claimed in claim 7 wherein said connector has a substantially S-shaped cross section and has a top part which forms said holding means for holding said display screen in position.

9. A display system including a display screen, which includes at least one electrical track, an electrical circuit for controlling said display screen, and a spring connector as claimed in claim 7, wherein said display screen and said electrical circuit are disposed substantially facing each other.

10. The display system claimed in claim 9 wherein said connector has a substantially S-shaped cross section and has a top part which forms said holder, and said spring connector is disposed so that said plastics material film is in contact with said track or tracks of said display screen and with said electrical circuit, said top part of said S-shape of said spring connector is interengaged with an edge of said display screen, and a free end part of a bottom part of said S-shape is in contact with said electric circuit and applies a reaction force thereto.

11. The display system claimed in claim 9 further comprising a control device for said display screen, wherein said control device is fixed to a face of said display screen and connected to at least one of said tracks of said display screen.

12. A terminal including a display system according to claim 9 and further including a support which supports said display screen and said electrical circuit and a spacer to maintain the spacing between said display screen and said electrical circuit.

* * * * *